(12) United States Patent
Park et al.

(10) Patent No.: US 8,221,045 B2
(45) Date of Patent: Jul. 17, 2012

(54) SEMICONDUCTOR DEVICE MANUFACTURING APPARATUS AND WAFER LOADING/UNLOADING METHOD THEREOF

(75) Inventors: Jun-Sig Park, Suwon-si (KR); Jung-Hyeon Kim, Hwaseong-si (KR); Jin-Ho Shin, Yongin-si (KR); Gennady Ivanov, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 711 days.

(21) Appl. No.: 12/350,705

(22) Filed: Jan. 8, 2009

(65) Prior Publication Data
US 2009/0191042 A1 Jul. 30, 2009

(30) Foreign Application Priority Data
Jan. 9, 2008 (KR) .................. 10-2008-0002411

(51) Int. Cl.
*H01L 21/677* (2006.01)
(52) U.S. Cl. ........ 414/152; 414/217; 414/810; 414/936; 414/941
(58) Field of Classification Search .................. 414/152, 414/936, 941, 217, 810
See application file for complete search history.

(56) References Cited

U.S. PATENT DOCUMENTS

| 6,752,585 B2* | 6/2004 | Reimer et al. | ................ 414/783 |
| 2003/0063967 A1* | 4/2003 | Antonell et al. | ......... 414/416.03 |

FOREIGN PATENT DOCUMENTS

| JP | 9-82648 | 3/1997 |
| JP | 2000-235974 | 8/2000 |
| KR | 10-2005-0040035 | 5/2005 |

OTHER PUBLICATIONS

The English Abstract is attached for KR1020050040035 submitted in an IDS on Jan. 8, 2009.

* cited by examiner

*Primary Examiner* — Scott Lowe
(74) *Attorney, Agent, or Firm* — F. Chau & Associates, LLC

(57) ABSTRACT

A semiconductor manufacturing apparatus and a wafer loading/unloading method thereof increase productivity. The semiconductor manufacturing apparatus includes a first boat and a second boat having a plurality of first slots and a plurality of second slots, respectively, and disposed such that the first slots and the second slots alternate each other, the first boat mounting a plurality of first wafers in the first slots to direct front faces of the first wafers in a predetermined direction, the second boat mounting a plurality of second wafers in the second slots to direct back faces of the second wafers in the predetermined direction; a reaction tube having an opening and containing the first and second boats mounting the first and second wafers; a plate sealing up the opening of the reaction tube containing the first boat and the second boat; a reaction gas supplier supplying reaction gas into the sealed reaction tube for a predetermined process; and a reaction gas exhauster exhausting the reaction gas from the reaction tube to the external of the reaction tube after the predetermined process.

15 Claims, 17 Drawing Sheets

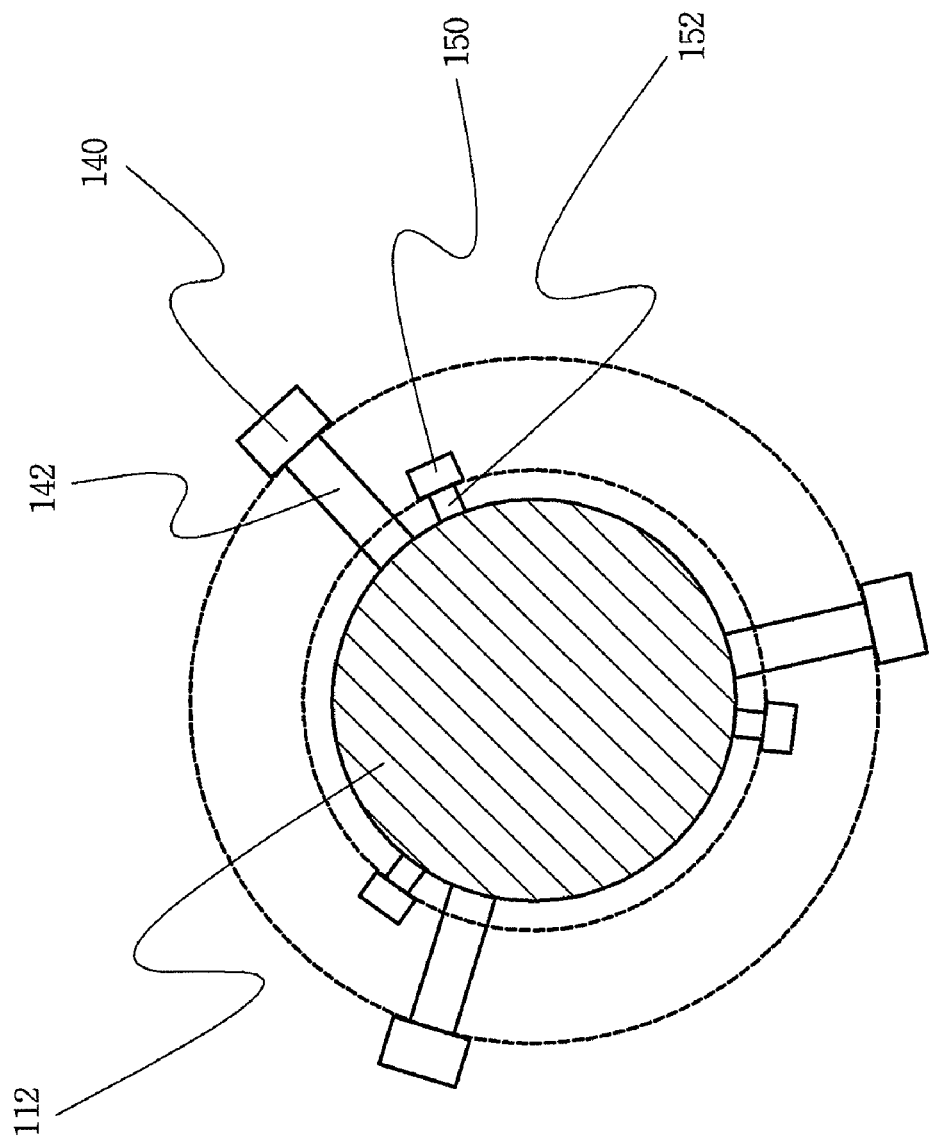

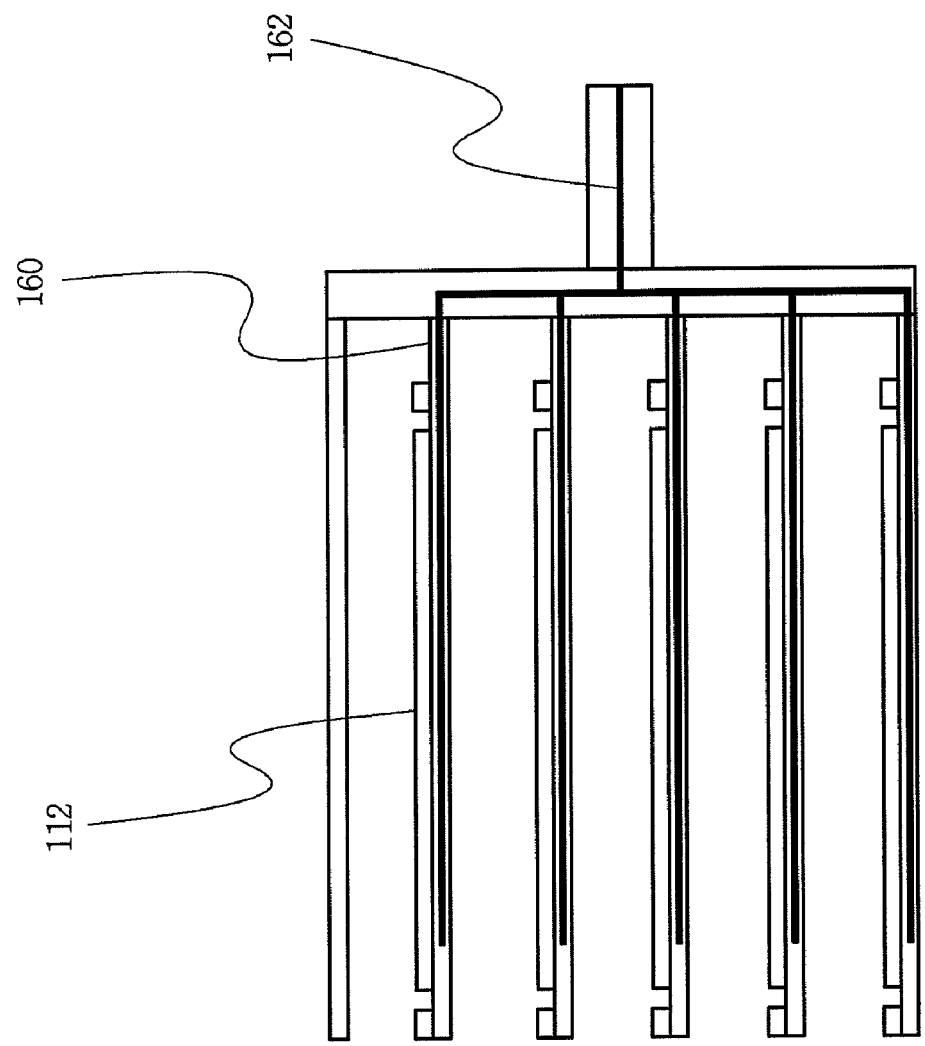

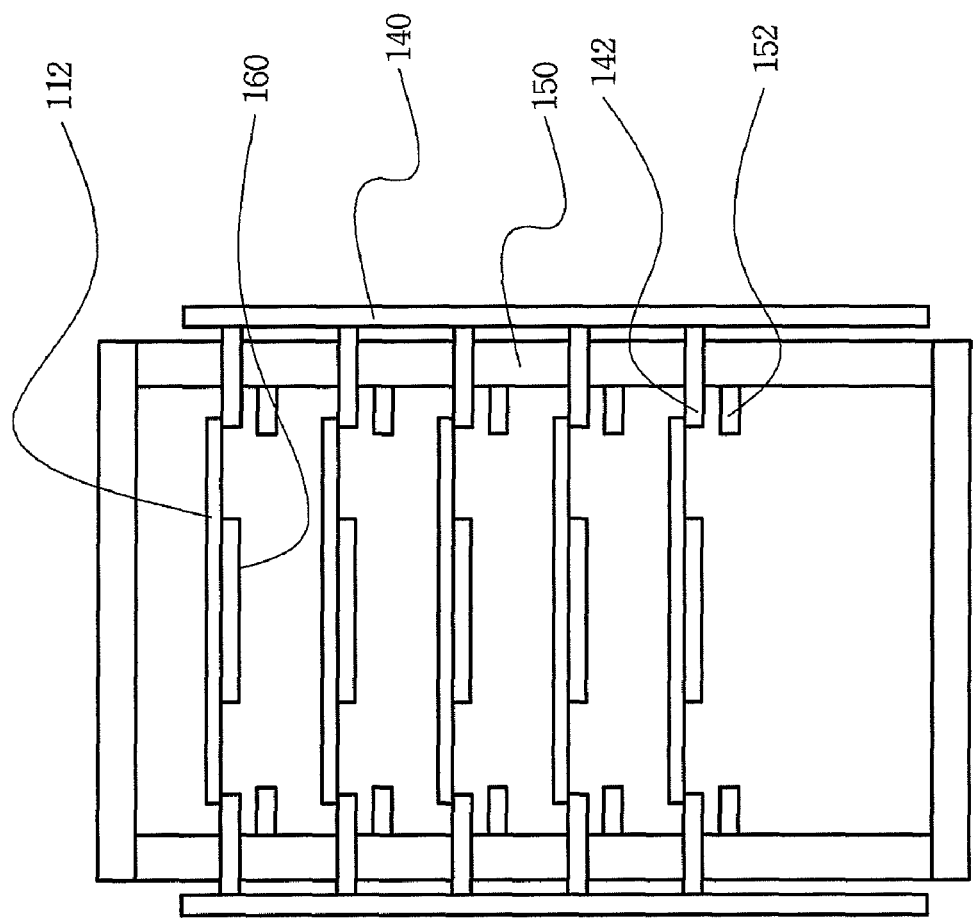

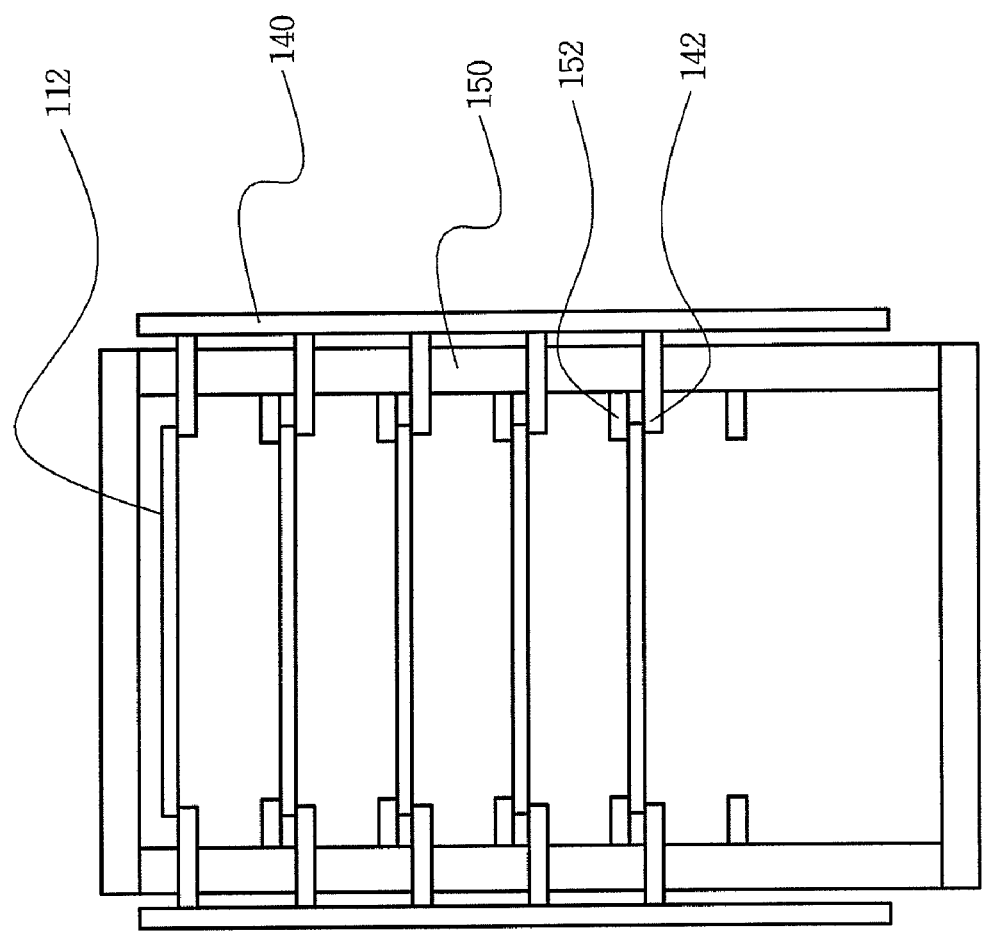

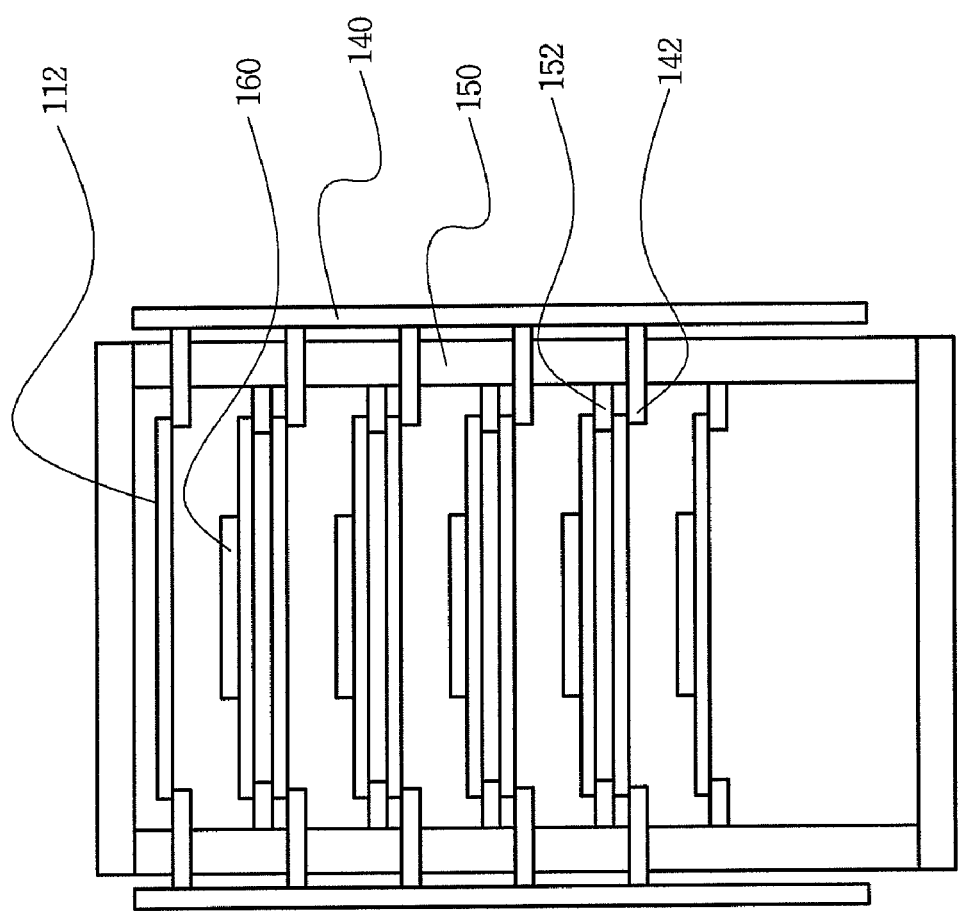

SEMICONDUCTOR DEVICE MANUFACTURING APPARATUS AND WAFER LOADING/UNLOADING METHOD THEREOF

CROSS-REFERENCE TO RELATED APPLICATIONS

This application claims priority under 35 U.S.C. §119 from Korean Patent Application 10-2008-0002411, filed on Jan. 9, 2008, the disclosure of which are hereby incorporated by reference in their entirety for all purposes as if fully set forth herein.

BACKGROUND

1. Technical Field

The present disclosure relates to semiconductor device manufacturing apparatuses, and more particularly, to a semiconductor device manufacturing apparatus for performing diffusion and deposition processes and to a wafer loading/unloading method thereof.

2. Description

A semiconductor device is generally manufactured through selective and repeated processes such as, for example, a photo, etching, diffusion, chemical vapor deposition, ion implantation, metal deposition on a wafer.

In the above-mentioned diffusion process, a process of diffusing impurity of a desired conductive type is performed on a wafer in a high-temperature atmosphere.

A semiconductor manufacturing apparatus performing the diffusion process may be employed to thermally diffuse conductive impurity such as, for example, phosphorus into a single crystal silicon or polysilicon at about 700° C. or more, or to heat the wafer in an oxygen atmosphere, thereby obtaining a thermal oxide layer, or to perform annealing and baking etc. Further, the semiconductor manufacturing apparatus may be used to get a deposition layer such as, for example, polysilicon layer and silicon nitride layer through a deposition process.

Such semiconductor manufacturing apparatuses undergoing diffusion and deposition processes are almost used as a batch type to process a plurality of wafers once in view of productivity. In the batch-type semiconductor manufacturing apparatus, relatively more wafers should be loaded within one reaction tube to cut down on production costs.

A semiconductor manufacturing apparatus according to the conventional art is described as follows, referring to the accompanied drawings.

FIG. 1 is a sectional view schematically illustrating a semiconductor manufacturing apparatus according to the conventional art.

With reference to FIG. 1, a conventional semiconductor manufacturing apparatus includes a reaction tube 10 having a bell shape, a heater 20 adapted surrounding the external part of reaction tube 10 to heat the interior of the reaction tube 10, a plate 30 raised from a lower part of the reaction tube 10 to seal up the reaction tube 10, and a boat 40 for loading with an equal interval a plurality of wafers 12 in an upper center part of the plate 30.

The semiconductor manufacturing apparatus may further include a reaction gas supplier for supplying reaction gas into the reaction tube 10, and an exhauster for exhausting gas after completing a corresponding process within the reaction tube 10.

In the boat 40, a plurality of slots 42 are formed to support with an equal interval, back faces 12b of the plurality of wafers 12 so that front faces 12a of the plurality wafers 12 are directed upward. The slot 42 is formed in a flute shape into which an outer circumference face of the wafer 12 is inserted, at a position that a gravity center of the wafer 12 corresponds to a center of the boat 40 within the boat 40, or in a shape the back face 12b of an edge of the wafer 12 can be loaded. The back faces 12b of the wafers 12 are supported by the plurality slots 42. For example, the wafer 12 may be supported by the plurality of slots 42 formed with an azimuth of about 120° within the boat 40.

That is, the boat 40 is formed as a single individual having plurality slots 42 in which a plurality of wafers 12 are inserted or loaded with a uniform interval in a stack structure. For example, the boat 40 is formed to load the wafers 12 of about 70 to about 150 sheets with a uniform interval therebetween, the wafer 12 having a diameter of 300 mm.

However, here the plurality of wafers 12 are stacked in one direction. Thus, for example, when the wafers are stacked below an appropriate interval, an error in corresponding diffusion and deposition processes may be caused or an error in a wafer loading/unloading operation may be caused. When a plurality of wafers 12 are loaded into the boat 40 with an interval of about 7.5 mm or below, it may be difficult to provide uniformity in the deposition process. Further, when the interval between the plurality of wafers 12 is lessened to 7.5 mm or below, an alignment margin between the wafers 12 and a blade of transfer robot loading/unloading the wafers 12 may not increase, thereby causing damage or scratches on the wafers 12.

In other words, in a semiconductor manufacturing apparatus according to the conventional art, a diffusion layer or deposition layer of given thickness can be formed on front faces 12a and back faces 12b of the plurality wafers 12 by loading with the same interval the plurality of wafers 12 having horizontal level within the boat 40 in which a plurality of slots 42 are formed with the same interval therebetween.

As described above, a semiconductor manufacturing apparatus according to the conventional art may have the following difficulties.

First, relatively more wafers 12 may not be loaded as the wafers 12 should be loaded limited within the boat 40 having a plurality of slots 42 formed to support back faces 12b of plurality wafers 12, thereby decreasing productivity.

Secondly, when an interval between plurality wafers 12 loaded in the boat 40 is reduced to below a proper level, damage and scratches on the wafers 12 may be caused due to a collision between a blade of transfer robot and the wafers 12, thereby decreasing a production yield.

SUMMARY

Exemplary embodiments of the invention provide a semiconductor manufacturing apparatus and a wafer loading/unloading method thereof, which can increase the number of wafers capable of being simultaneously processed so as to increase productivity. In addition, damage and scratches on wafers causable by a collision between a blade of transfer robot and wafers can be prevented even when an interval between a plurality of wafers is reduced to a given level or below, thereby increasing production yield.

In accordance with an exemplary embodiment of the invention, a semiconductor manufacturing apparatus is provided. The semiconductor manufacturing apparatus includes a first boat and a second boat having a plurality of first slots and a plurality of second slots, respectively, and disposed such that the first slots and the second slots alternate each other, the first boat mounting a plurality of first wafers in the first slots to direct front faces of the first wafers in a predetermined direction, the second boat mounting a plurality of second wafers in the second slots to direct back faces of the second wafers in the predetermined direction; a reaction tube having an opening and containing the first and second boats mounting the first and second wafers; a plate sealing up the opening of the reaction tube containing the first boat and the second boat; a reaction gas supplier supplying reaction gas into the sealed reaction tube for a predetermined process; and a reaction gas exhauster exhausting the reaction gas from the reaction tube to the external of the reaction tube after the predetermined process.

In accordance with an exemplary embodiment of the invention, a semiconductor manufacturing apparatus is provided. The semiconductor manufacturing apparatus includes a first boat and a second boat having a plurality of first slots and a plurality of second slots, respectively, and disposed such that the first slots and the second slots alternate each other; a transfer robot holding a plurality of first wafers with a plurality of blades, loading the first wafers into the first slots to direct front faces of the first wafers in a predetermined direction, holding a plurality of second wafers with the plurality of blades, and loading the second wafers into the second slots to direct back faces of the second wafers in the predetermined direction; a reaction tube having an opening and containing the first and second boats mounting the first and second wafers; a plate sealing up the opening of the reaction tube containing the first boat and the second boat; a reaction gas supplier supplying reaction gas into the sealed reaction tube for a predetermined process; a reaction gas exhauster exhausting the reaction gas from the reaction tube to the external of the reaction tube after the predetermined process.

In accordance with an exemplary embodiment of the invention, a wafer loading/unloading method is provided for use in a semiconductor manufacturing apparatus including a first boat and a second boat which have a plurality of first slots and a plurality of second slots, respectively, and are disposed such that the first slots and the second slots alternate each other. The method includes: loading a plurality of first wafers into the first slots to direct front faces of the first wafers in a predetermined direction; loading a plurality of second wafers into the second slots to direct back faces of the second wafers in the predetermined direction; making the distance between facing front faces of neighboring first and second wafers larger than the distance between facing back faces of neighboring first and second wafers; performing a predetermined process on the front faces of the first and second wafers; and unloading the first and second wafers from the first and second slots.

As described above, according to some exemplary embodiments of the invention, a plurality of wafers can be loaded with relatively greater numbers by using first and second boats provided to make back faces of wafers mutually approximate and make front faces of wafers mutually distanced, thereby increasing productivity.

Damage and scratches in wafers caused by a collision between a blade of transfer robot and wafers can be prevented by using first and second boats that are provided to alternately support a plurality of wafers and control an interval between the plurality of wafers.

BRIEF DESCRIPTION OF THE DRAWINGS

Exemplary embodiments of the present invention can be understood in more detail from the following description taken in conjunction with the attached drawings in which:

FIG. 4 provides a plan view of FIG. 3;

FIGS. 5A and 5B are sectional views illustrating a plurality of blades for sucking in vacuum the back faces of the plurality of wafers;

FIGS. 7A through 7I are sectional views providing the sequence of the wafer loading/unloading method in a semiconductor manufacturing apparatus.

DETAILED DESCRIPTION OF THE EMBODIMENTS

Exemplary embodiments of the present invention now will be described more fully hereinafter with reference to FIGS. 2 to 7, in which exemplary embodiments of the invention are shown. This invention may, however, be embodied in many different forms and should not be construed as limited to the exemplary embodiments set forth herein.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 7. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. For purposes of clarity, a detailed description of known functions and systems has been omitted.

Figure 1:
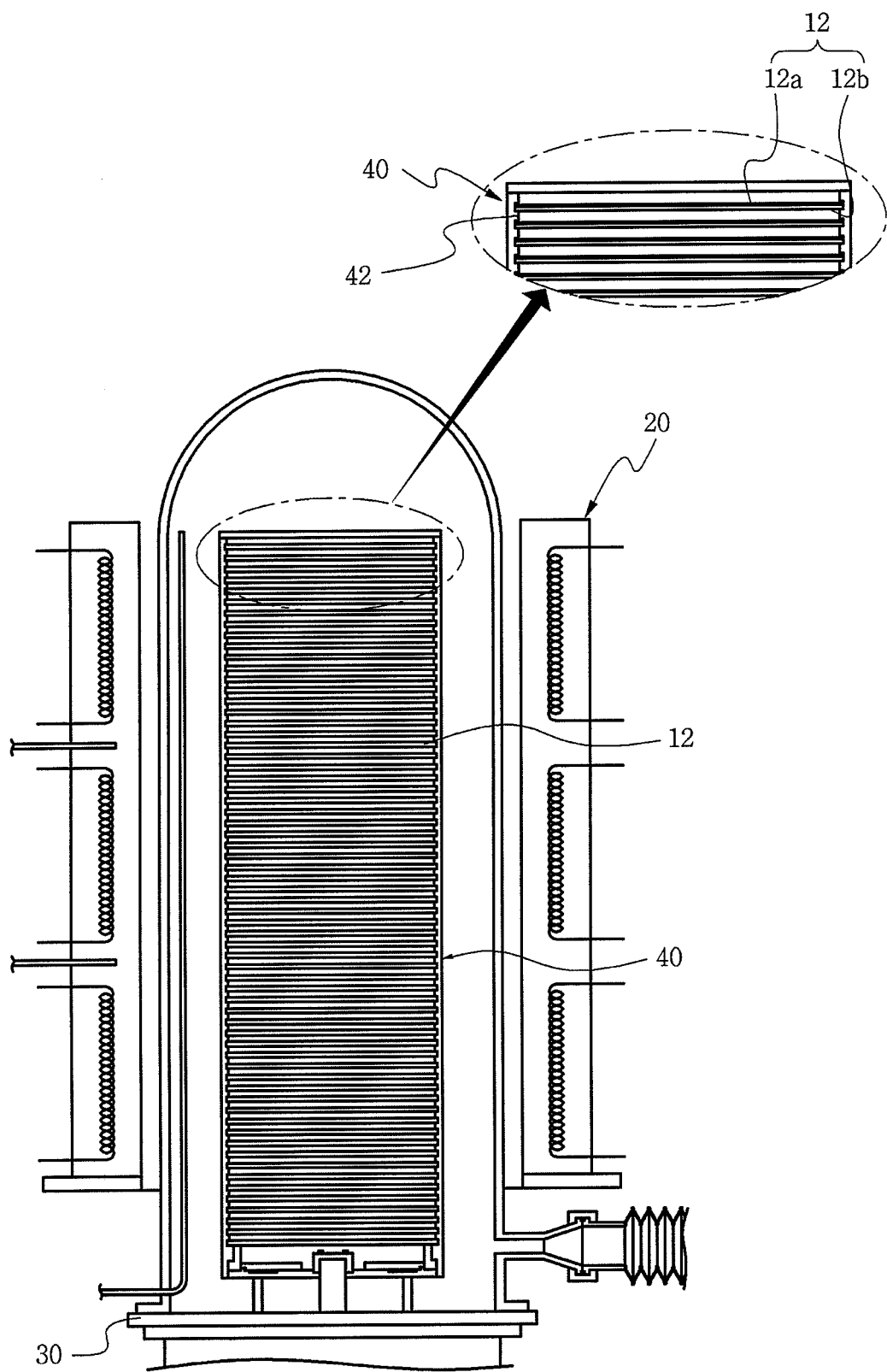
FIG. 1 is a sectional view schematically illustrating a semiconductor manufacturing apparatus according to the conventional art.
Figure 2:
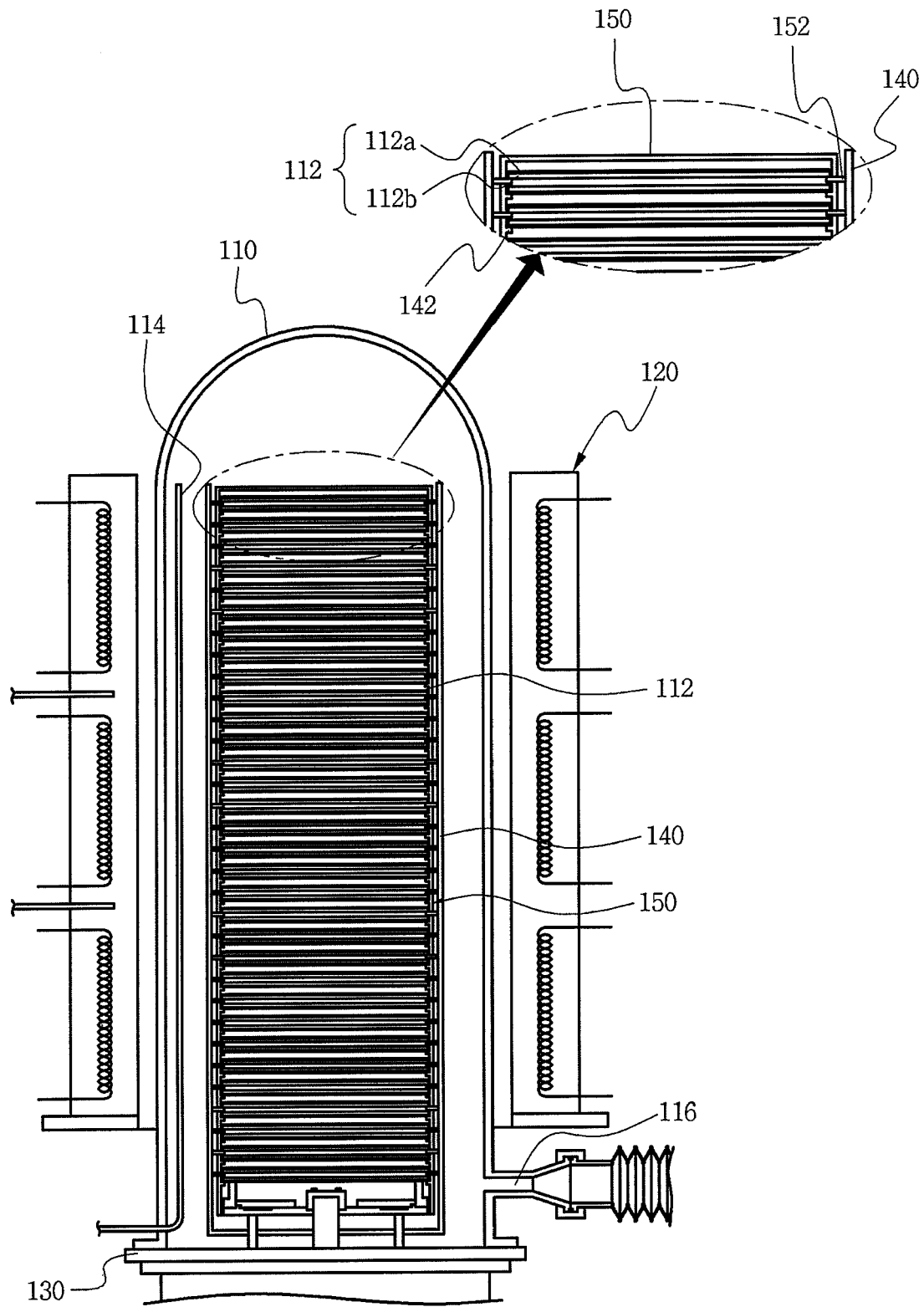
FIG. 2 is a sectional view schematically illustrating a semiconductor manufacturing apparatus according to an exemplary embodiment of the invention.
Figure 3:
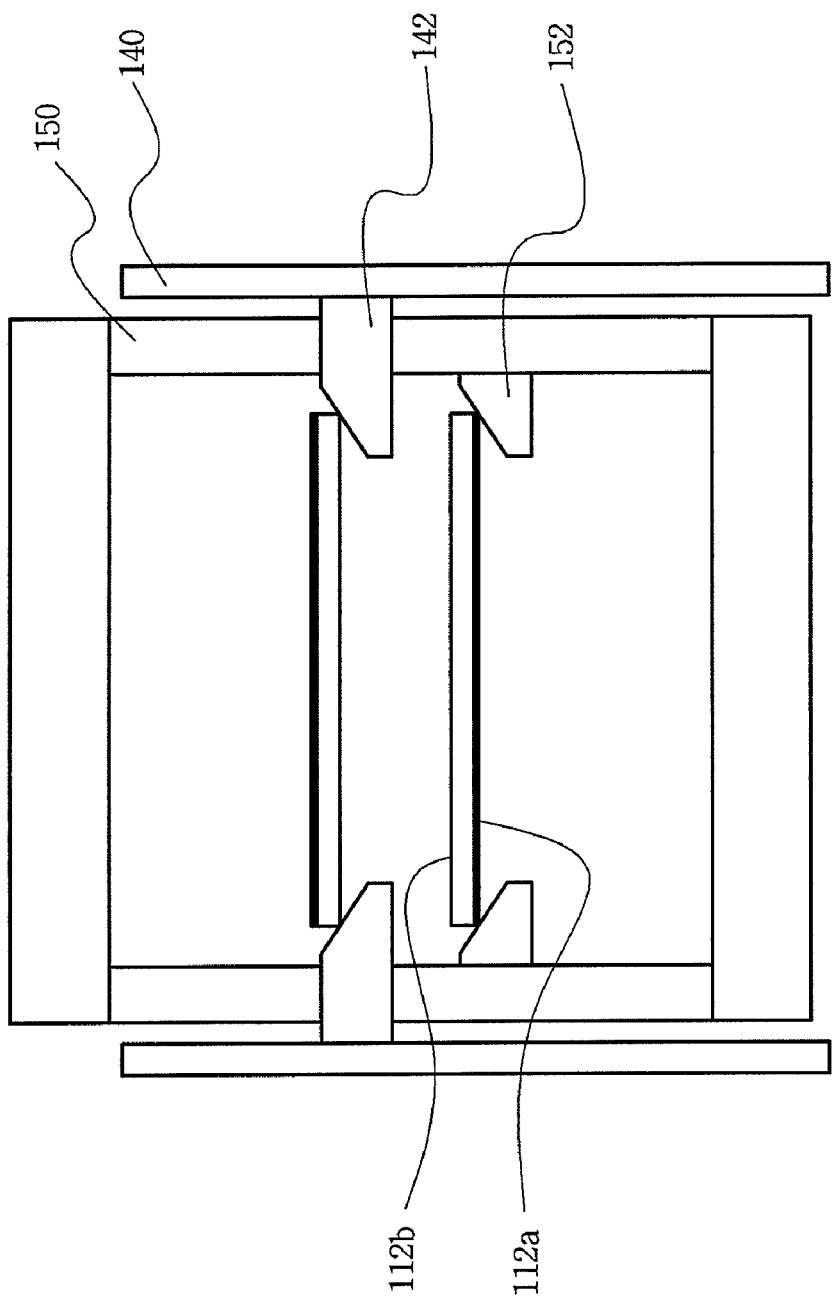
FIG. 3 is a sectional view illustrating first and second boats of FIG. 2.

FIG. 2 is a sectional view schematically illustrating a semiconductor manufacturing apparatus according to an exemplary embodiment of the invention. FIG. 3 is a sectional view illustrating first and second boats 140 and 150 of FIG. 2. FIG. 4 provides a plan view of FIG. 3.

As shown in FIGS. 2 to 4, a semiconductor manufacturing apparatus according to an exemplary embodiment of the invention includes a reaction tube 110 having, for example, a bell shape, a heater 120 surrounding an external part of the reaction tube 110, a plate 130 raised from a lower part of the reaction tube 110 and which seals up the inside of the reaction tube 110, and a first boat 140 and a second boat 150 for loading with an unequal interval a plurality of wafers 112 in a center upper part of the plate 130.

The semiconductor manufacturing apparatus may further include a reaction gas supplier for supplying reaction gas into the reaction tube 110, and an exhauster for exhausting gas after a completion of corresponding diffusion process or deposition process in the reaction tube 110.

Here, the directions of the first and second boats 140 and 150 supporting the plurality of wafers 112 are different from each other. For example, the first boat 140 supports the back face 112*b* of the wafers 112, and the second boat 150 supports the front face 112*a* of the wafers 112. The first boat 140 includes a plurality of first slots 142 supporting an edge portion of back face 112*b* of the wafers 112, and the second boat 150 includes a plurality of second slots 152 supporting an edge portion of front face 112*a* of the wafers 112. Here it may be configured, of course, such that the first boat 140 supports the front face 112*a* of the wafers 112 and the second boat 150 supports the back face 112*b* of the wafers 112.

The plurality of wafers 112 loaded in the first and second boats 140 and 150 are positioned crossed so that respective front faces 112 of the wafers 112 are opposed to each other and respective back faces 112*b* thereof are opposed to each other. The distance between the back faces of the wafers 112 is shorter than the distance between the front faces 112*a* of the wafers 112. This is why a thin film obtained through a diffusion or deposition process is selectively required only on the face 112*a* of the wafer 112. For example, the distance between the front faces 112*a* of the wafers 112 may be about 7.5 millimeters (mm) or more, and the distance between the back faces 112*b* may be to about 0 in theory. That is, that plurality of wafers 112 loaded in the first and second boats 140 and 150 may be positioned such that the back faces 112*b* are face to face and approximated to each other and the front faces 112*a* are face to face and are distanced from each other.

Therefore, in a semiconductor manufacturing apparatus according to an exemplary embodiment of the invention, a plurality of wafers 112 can be loaded by using the first and second boats 140 and 150 such that the back faces 112*b* of the wafers 112 become approximate to each other and the front faces 112*a* of the wafers 112 become distanced from each other, thereby substantially increasing productivity.

For example, within the first and second boats 140 and 150 positioned such that the back faces 112*b* of the wafers 112 become approximate to each other and the front faces 112*a* of the wafers 112 become face to face with a distance of about 7.5 mm, about 150 to 200 sheets of wafers 112 can be loaded. As compared with a conventional single boat 140 in which about 100 to about 150 sheets of wafers 112 can be loaded with a distance of about 7.5 mm, in a semiconductor manufacturing apparatus according to an exemplary embodiment of the invention the wafers 112 of about 1.5 times can be more loaded therein in performing the diffusion or deposition process.

When the first and second boats 140 and 150 are provided into the reaction tube 110, reaction gas supplied from the reaction gas supplier flows on the front faces 112*a* of the wafers 112 positioned face to face, thereby selectively forming a diffusion layer or deposition layer on the front faces 112*a* of the wafers 112. Before supplying the reaction gas to the reaction tube 110, the plate 130 is raised by an elevator adapted in a lower part thereof, so as to seal up the reaction tube 110.

The reaction gas supplier includes a spraying tube 114 for spraying reaction gas in a given spraying pressure from a side face of the plurality of wafers 112 loaded in the first and second boats 140 and 150. At this time, reaction gas sprayed from the spraying tube 114 flows in a gaseous state of high temperature, and to prevent the reaction gas from condensing on the surface of wafers 112, the heater 120 can heat the inside of reaction tube 110. In addition, a heater block heating in a lower part of the plurality of wafers 112 loaded above the plate 130 may be further provided.

The reaction tube 110 is called a tube, and may be formed of, for example, a monolithic single tube according to the conditions required in the process of forming impurity diffusion layer and thermal oxide layer, or may be formed of, for example, an external tube and an internal tube based on a separation type according to the conditions required in the process of forming polysilicon layer and silicon nitride layer. At this time, the conditions required in respective processes have a difference in the vacuum level and process temperature inside the reaction tube 110. For example, reaction tube 110 of the separation type is mainly used in a deposition process sensitive to the vacuum level by buffering the flow of reaction gas between the internal and external tubes. On the other hand, monolithic reaction tube 110 is mainly used in a diffusion and thermal process of a simple heating scheme insensitive to the vacuum level.

The exhauster can maintain a uniform vacuum level inside the reaction tube 110 by pumping the reaction gas supplied into the reaction tube 110 and gas provided after the reaction. For example, the exhauster is provided including a dry pump or rotary pump for pumping the reaction gas and gas provided after the reaction through an exhaust line 116 coupled to one side of the reaction tube 110 so as to maintain in a low vacuum of about $1 \times 10^3$ Torr the inside of the reaction tube 110.

On the other hand, the first and second boats 140 and 150 are designed to control an interval between the plurality of wafers 112 loaded in the boats. For example, the first boat 140 is a movable boat that is raised/lowered with a given distance, supporting the back faces 112*b* of the plurality of wafers 112, and the second boat 150 is a fixed boat fixed supporting the front faces 112*a* of the plurality of wafers 112. In addition, a precision elevator for raising and lowering the first boat 140 is provided in a lower part of the first boat 140.

To sequentially load the plurality of wafers 112 in the first and second boats 140 and 150, a previously loaded wafer 112 should be spaced by a given distance from an upper part of corresponding wafer 112. This is why a sufficient space between an antecedently loaded wafer 112 and a subsequently loaded wafer 112 should be obtained.

To load wafer 112 in a first slot 142 of the first boat 140, the distance from a second slot 152 provided below the first slot 142 should be reduced, and the distance from the second slot 152 provided above the first slot 142 should be increased. Similarly, to load wafer 112 in the second slot 152 of the second boat 150, the distance from the first slot 142 provided below the second slot 152 should be reduced, and the distance from the first slot 142 provided above the second slot 152 should be increased.

Therefore, in a semiconductor manufacturing apparatus according to an exemplary embodiment of the invention, the breaking and scratching of a wafer 112 caused by a collision between a blade 160 of transfer robot and the wafer 112 can be prevented by using the first and second boats 140 and 150 that are provided to alternately support the plurality of wafers 112 and control an interval between the plurality of wafers 112, thereby increasing a production yield.

Here the first slot 142 and the second slot 152 are formed in the structure to respectively support the wafers 112 loaded therein, with a substantially lessened mutual interference, and to simultaneously protect the wafers 112. For example, the first and second slots 142 and 152 have a tilted support face of a given angle supporting the wafer 112. Thus, when the first boat 140 moves for the second boat 150 and so the first and second slots 142 and 152 become near, a given margin between the wafer 112 supported by the tilted support face and each slot 142 can be obtained, thereby substantially lessening damage to the wafer 112.

As described above, the second boat 150 is normally positioned supporting the front face 112*a* of the wafer 112 by the second slot 152 of the second boat 150 so that the back face 112b of the wafer 112 is directed upward. On the other hand, the first boat 140 is positioned, supporting the back face 112b of the wafer 112 by the first slot 142 of the first boat 140 so that the front face 112a of the wafer 112 is directed upward. Thus, the transfer robot should load and unload the plurality of wafers 112 loaded in a wafer cassette, into the first and second boats 140 and 150, in mutually opposite directions of the first and second boats 140 and 150. Further, the transfer robot moves once in a given unit the plurality of wafers 112 in the movement between the first and second boats 140 and 150 and the wafer cassette. This is why when moving the plurality of wafers 112 one sheet by one sheet, the productivity decreases through the transfer of wafers 112.

When the transfer robot horizontally moves the plurality of wafers 112 from the wafer cassette to the first slot 142 of the first boat 140, the plurality of wafers 112 should rotate about 180 degrees and move from the wafer cassette to the second slot 152 of the second boat 150. There may be several methods for rotating the plurality of wafers 112 through the transfer robot. First, the transfer robot may perform the rotation by, for example, sucking in by a vacuum the back faces of the plurality of wafers 112. Also the plurality of wafers 112 may be rotated by, for example, lessening the distance between blades 160 inserted into between the plurality of wafers 112. And the rotation may be performed by, for example, clamping the outer circumference face of the plurality of wafers through a mechanical force.

Figure 5B:
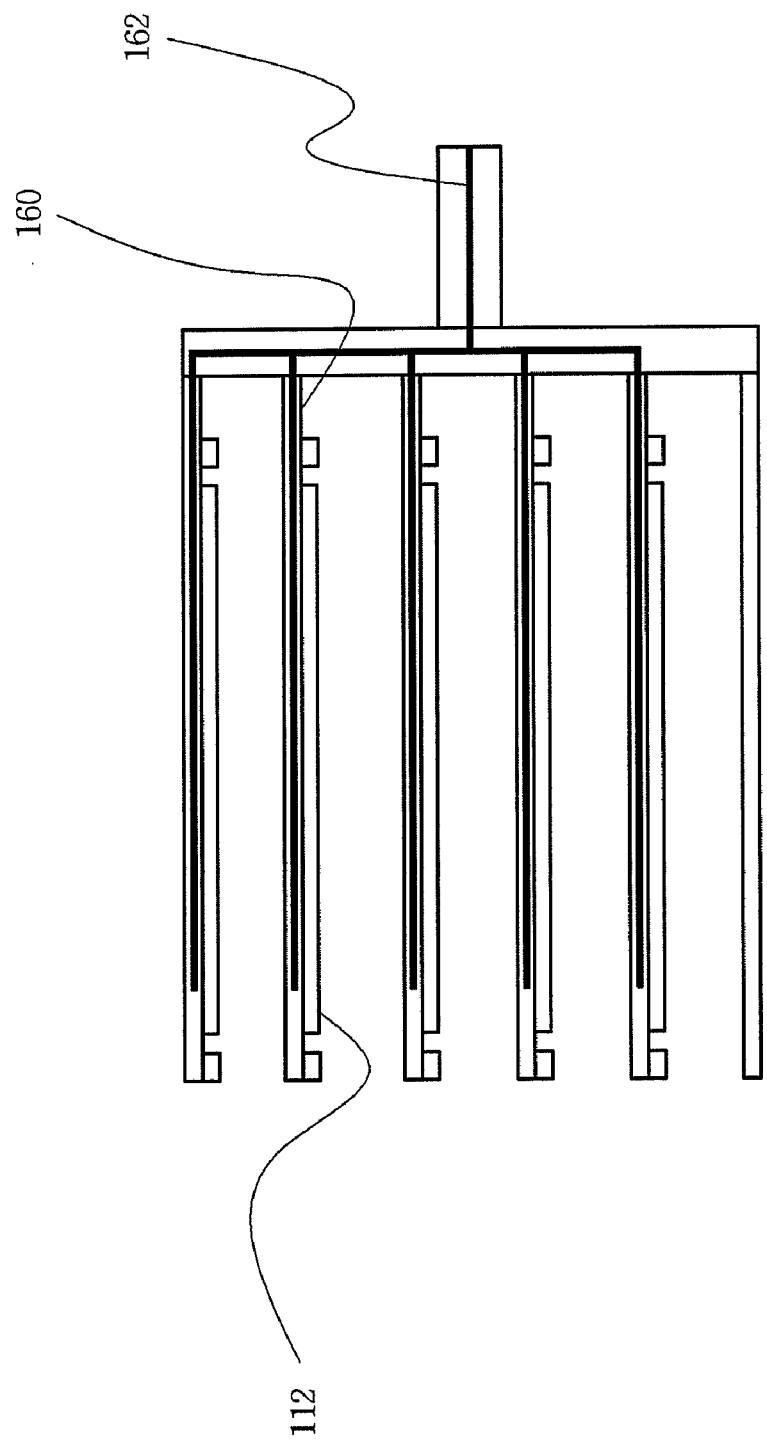

FIGS. 5A and 5B are sectional views illustrating a plurality of blades 160 for sucking in by a vacuum the back faces of the plurality of wafers 112. When vacuum pressure is generated through a vacuum line 162 provided within the plurality of blades 160 supporting the back faces 112b of the plurality of wafers 112, the plurality of wafers 112 rotate. Here, the plurality of blades 160 are provided so that the plurality of wafers 112 are loaded into the first slot 142 of the first boat 140 or into the second slot 152 of the second boat 150. For example, the plurality of blades 160 are configured to load the plurality of wafers 112 with an interval of about 15 mm and move the wafers and then load the wafers 112 into the first slot 142 or second slot 152. That is, the plurality of blades 160 are provided to rotate at an end part of transfer robot arm and so suck in by a vacuum the plurality of wafers 112 with a given interval. Moreover, a vacuum pump for pumping air from the vacuum line 162 may provide a given vacuum pressure through the vacuum line 162 provided within the plurality blades 160.

Figure 6A:
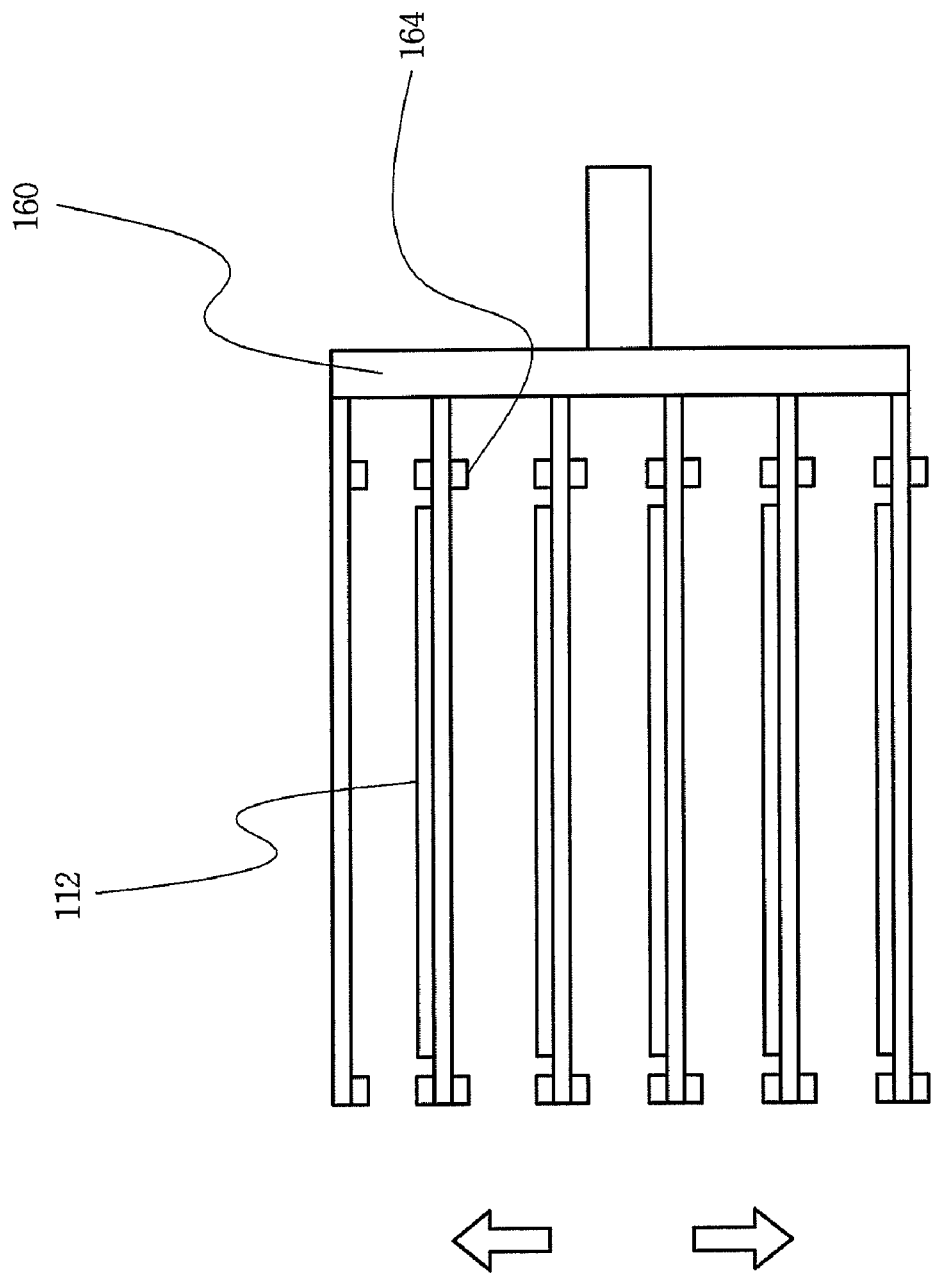
FIGS. 6A and 6B are sectional views of transfer robot for rotating the wafers by reducing a distance between blades.
Figure 6B:
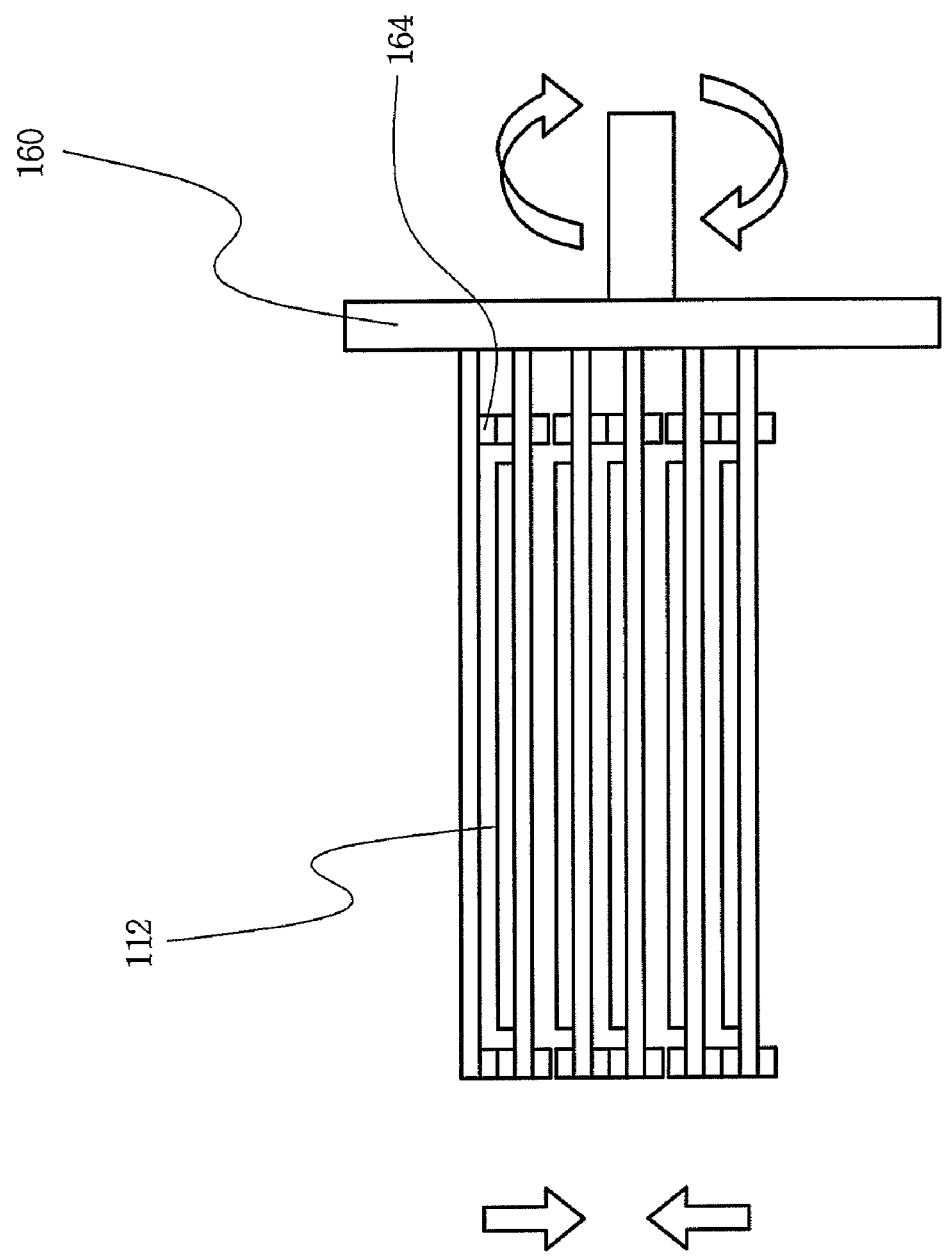

FIGS. 6A and 6B are sectional views of transfer robot for rotating the wafers 112 by reducing the distance between the blades 160. The transfer robot can reduce the distance between the blades so as to prevent the wafers 112 from moving or deviating from the blades during rotating, and then rotate the wafers 112. Here the blade 160 is configured with a structure to stably support the wafers 112 of a circular shape. Further, a guide 164 is formed protruding with a given height at a position approximate to an outer circumference face of the wafer 112 so as to prevent the wafer 112 from being separated in a horizontal direction. The guides 164 are symmetrically provided not only on an upper part of the blade 160 but on a lower part of the blade 160. This is why the guide 164 can provide the structure of reducing the distance between the blades 160 to rotate the wafer 112 and so surrounding the wafer 112. Here, centering on the wafer 112, the thickness of a plurality of guides 164 provided on the blades 160 provided in upper and lower parts of the wafer 112 is thicker than the thickness of wafer 112.

In addition, for example, when the guide 164 is selectively formed only on the blade 160, the protruded level of the guide 164 should be larger than the thickness of wafer 112.

Therefore, in a semiconductor manufacturing apparatus according to an exemplary embodiment of the invention, the plurality of wafers 112 are loaded into the first and second boats 140 and 150 so that the back faces 112b and the front faces 112a of the wafers are supported respectively and alternately by the boats, and further the interval between the plurality of wafers 112 is controlled, thereby enhancing the productivity in the diffusion or deposition process.

With the configuration described above, a wafer loading/unloading method for use in a semiconductor manufacturing apparatus according to an exemplary embodiment of the invention is described as follows.

FIGS. 7A through 7I are sectional views providing the sequence of the wafer loading/unloading method in a semiconductor manufacturing apparatus.

Figure 7A:
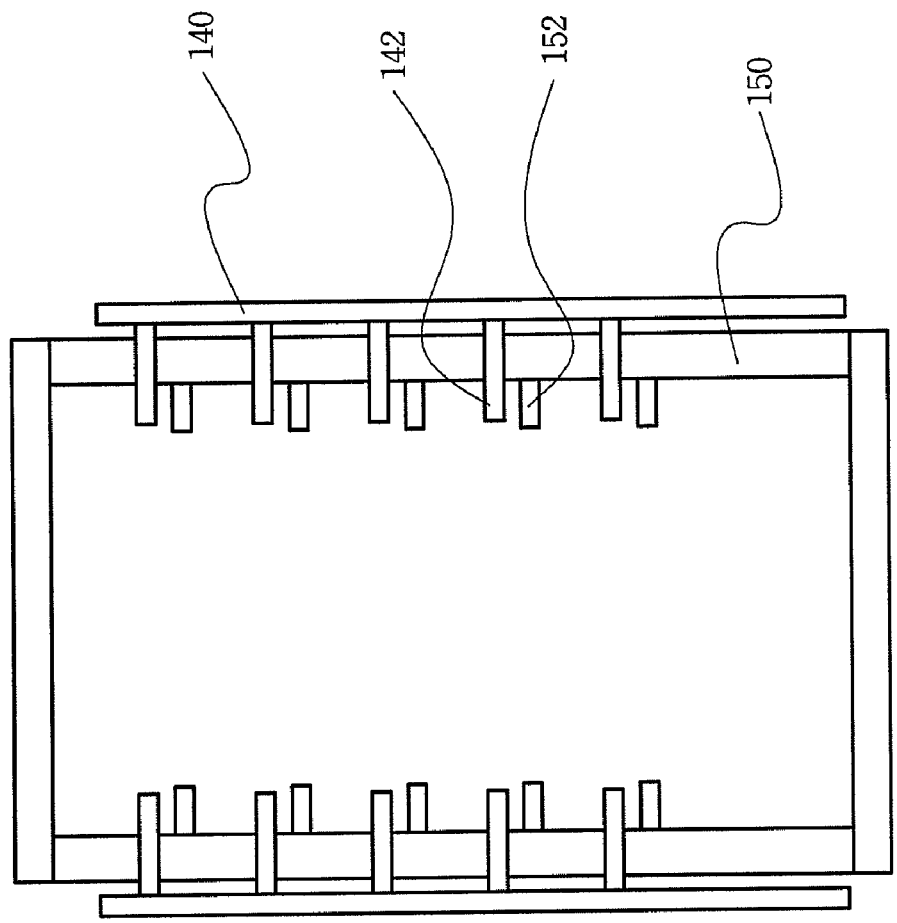

As shown in FIG. 7A, the first boat 140 is lowered so that the second slot 152 of the second boat 150 becomes approximate to a lower part of the first slot 142 of the first boat 140. Here, initially, the first and second slots 142 and 152 are positioned to have a given interval in a vertical direction so that the plurality of wafers 112 are loaded with the same interval therebetween. Thus, the distance of the second slot 152 from an upper part of the first slot 142 should have a given interval so that the wafer 112 can be safely loaded in the first slot 142 in a subsequent step. For example, the first boat 140 can be lowered so that the first slot 142 is distanced about 4.75 mm from the second slot 152 provided above the first slot 142, and so that the first slot 142 becomes approximate about 0.75 mm to the second slot 152 provided in a lower part of the first slot 142.

With reference to FIG. 7B, the plurality of wafers 112 whose back faces 112b supported and transferred by the blade 160 of the transfer robot, are stably loaded into the first slots 142 of the first boat 140. That is, transfer robot can transfer the plurality of wafers 112 stored in wafer cassette to the first slot 142 of the first boat 140 in a state that the back faces 112b of the plurality of wafers 112 are supported by the plurality of blades 160. The plurality of blades 160 supporting the plurality of wafers 112 horizontally move to upper parts of the first slots 142, and then vertically move to load the plurality of wafers 112 in the first slots 142.

As illustrated in FIG. 7C, the first boat 140 is raised so that the first slots 142 storing the plurality of wafers 112 become approximate to the second slot 152 positioned above the first slot 142. Here the plurality of wafers 112 stored in the first slots 142 are raised a given height by a movement of the first boat 140, thereby substantially reducing the interference between the plurality of wafers 112 stored in the first slots 142 and the plurality of wafers 112 to be loaded on the second slots 152. For example, the first slot 142 may be raised to a height level of about 4 mm. The raised distance of the first slot 142 may become a space where the plurality of wafers 112 to be subsequently loaded in the second slots 152 horizontally move and then vertically move by the blade 160 of the transfer robot. Thus, the plurality of wafers 112 subsequently inserted between the plurality of wafers 112 loaded in the first slots 142 of the first boat 140 can be loaded in the second slots 152 of the second boat 150 without a collision.

As shown in FIG. 7D, the transfer robot rotates about 180 degrees the plurality of wafers 112, and loads the wafers so that the front faces 112a of the plurality of wafers 112 are loaded in the second slots 152. That is, the transfer robot horizontally moves the plurality of wafers 112 from wafer cassette in a state that the back faces 112b of the wafers 112 are supported by the plurality of blades 160. Then, the plurality of wafers 112 rotate about 180 degrees by sucking in by a vacuum the back faces 112b of the plurality of wafers 112. And then, the front faces 112a of the plurality of wafers 112 are loaded in the second slots 152.

Figure 7E:
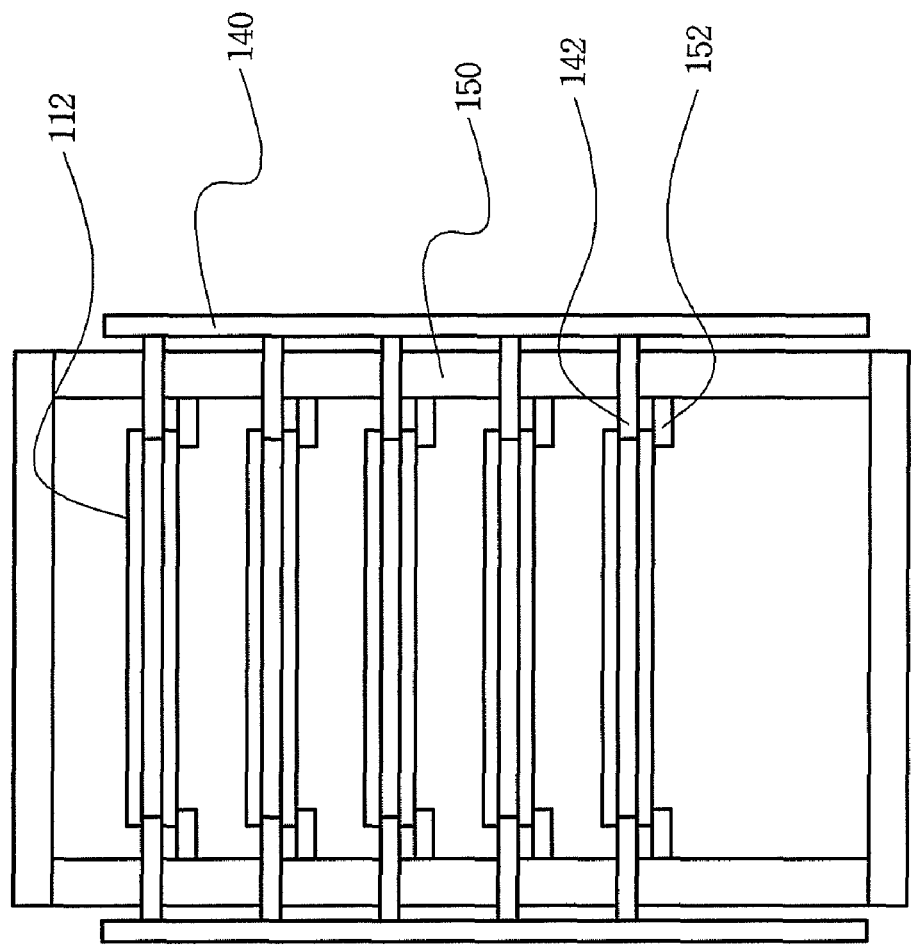

As shown in FIG. 7E, the first boat 140 is lowered so that the first slots 142 supporting the back faces 112b of the plurality of wafers 112 become approximate to the second slots 152, and a subsequent diffusion or deposition process for the plurality of wafers 112 is performed. Here, the first boat 140 is lowered so that the first slot 142 is approximated to the second slot 152 provided in a lower part of the first slot 142. For example, the first slot 142 is lowered to a height level of about 4 mm so that the back faces 112b of the plurality of wafers 112 supported by the first and second slots 142 and 152 are approximated and the front faces 112a of the plurality of wafers 112 are distanced from each other.

Further, in the diffusion or deposition process, a reaction gas supplied from reaction gas supplier into the reaction tube 110 flows on the front faces 112a of the wafers 112, thereby selectively forming a diffusion layer or deposition layer on the front faces 112a of the plurality of wafers 112. Therefore, a reaction gas flows on the front faces 112a of the wafers 112 supported by the first and second slots 142 and 152, thereby forming the diffusion layer or deposition layer thereon. For example, the distance between front faces 112a of the wafers 112 is about 5 mm to 6.5 mm. Then, after a completion of diffusion or deposition process, an unloading operation of the plurality of wafers 112 may be performed in a sequence opposite to the loading sequence of the plurality of wafers 112.

Figure 7F:
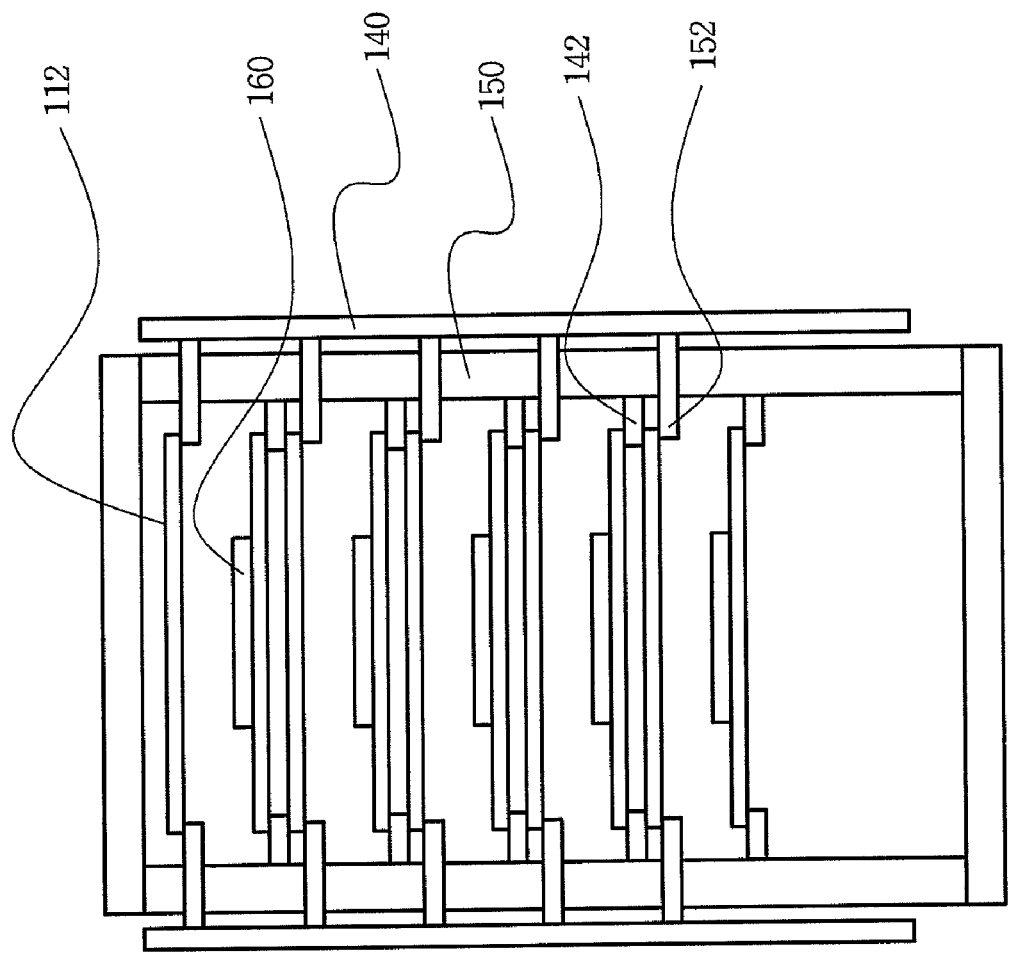

As shown in FIG. 7F, when the diffusion or deposition process for the plurality of wafers 112 is completed, the first boat 140 is raised so that the first slot 142 supporting the back face 112b of the wafers 112 is distanced from the second slot 152 provided in a lower part of the first slot 142. Here, when the first boat 140 is raised, blade 160 is inserted into between the first slot 142 and second slot 152 provided in a lower part of the first slot 142 in a subsequent process, and the plurality of wafers 112 supported by the second slot 152 are sucked in by a vacuum and unloaded. For example, the first boat 140 raises the first slot 142 by a height of about 4 mm.

Figure 7G:
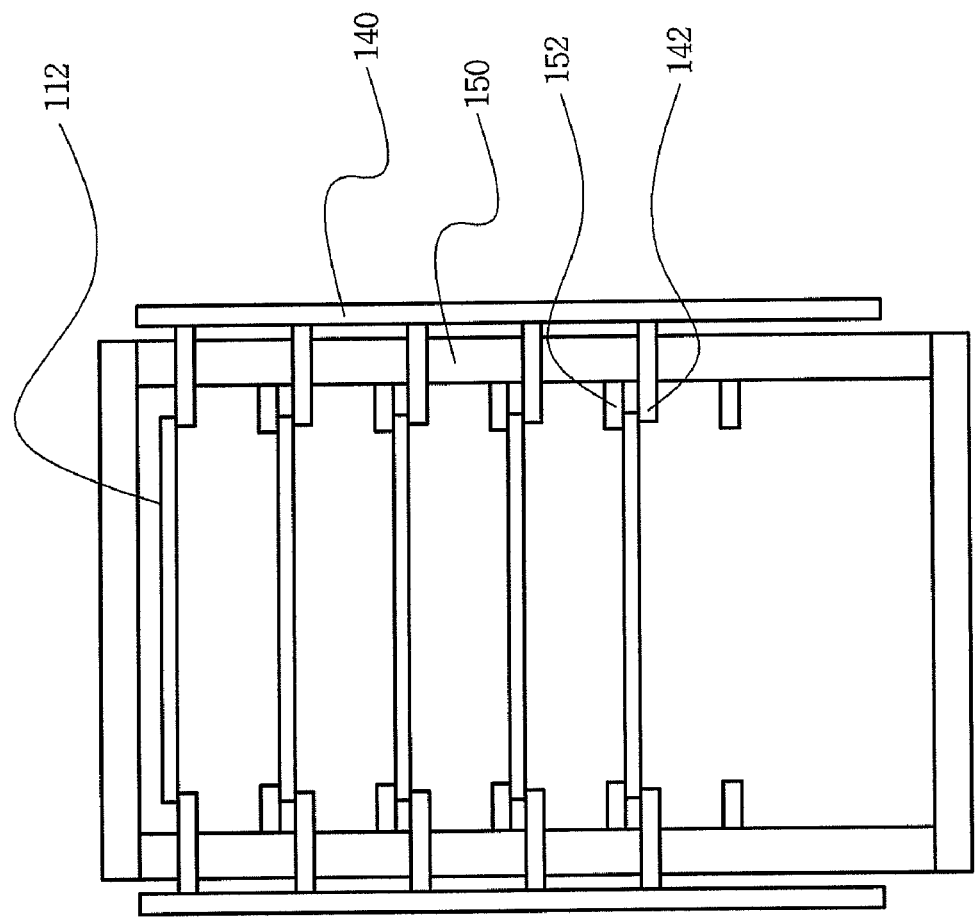

With reference to FIG. 7G, the plurality of wafers 112 supported by the second slot 152 are unloaded by using the transfer robot and then rotate about 180 degrees and are stored in wafer cassette. Here the blade 160 of transfer robot sucks in by a vacuum the back face of the wafers 112 whose front face 112a is supported by the second slot 152, and unload the plurality of wafers 112 from the inside of first and second boats 140 and 150. Then, the plurality of wafers 112 rotate about 180 degrees to be loaded within the wafer cassette.

Figure 7H:
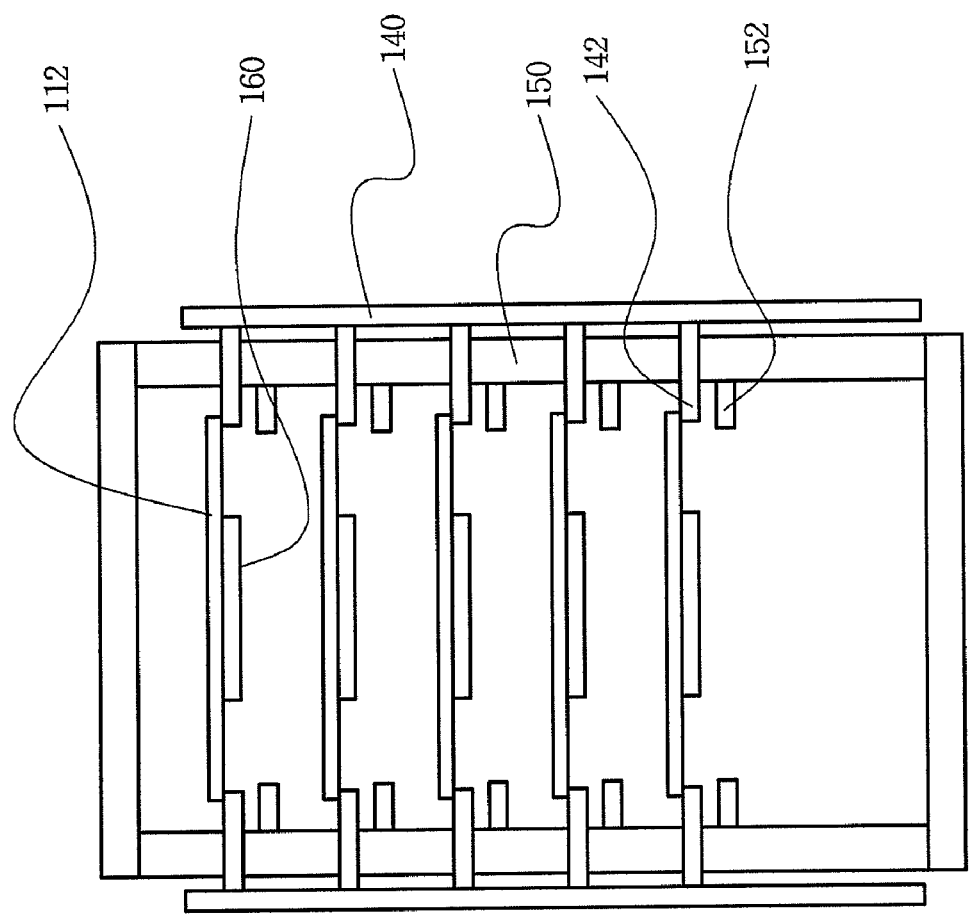

As shown in FIG. 7H, the first boat 140 is lower so that the first slot 142 supporting the back face 112b of the wafers 112 is approximated to the second slot 152 provided in a lower part of the first slot 142. For example, the first boat 140 moves to lower about 4 mm the first slot 142. Subsequently, the plurality of wafers 112 supported by the first slots 142 vertically float by the blades 160, thereby preventing a collision between the second slot 152 provided above the first slot 142 and the plurality of wafers 112.

Figure 7I:
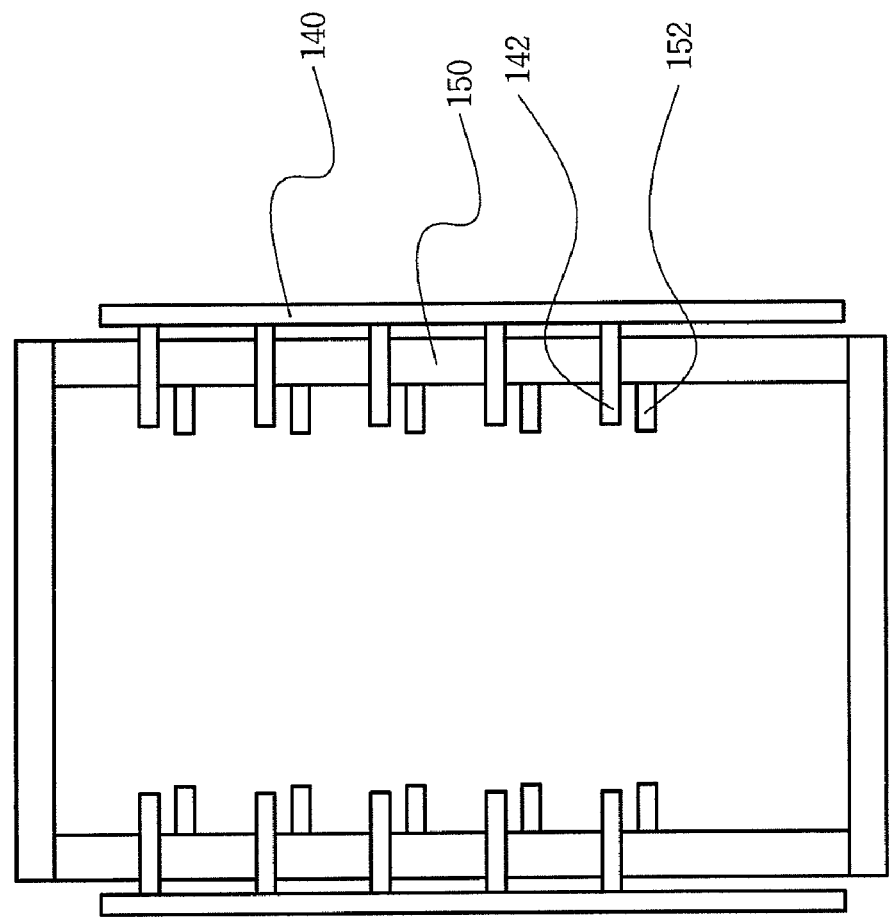

As shown in FIG. 7I, the plurality of wafers 112 supported by the first slot 142 are unloaded by using transfer robot, and then are stored in the wafer cassette. Here the blade 160 of transfer robot horizontally moves, supporting the back face 112b of the wafers 112 supported by the first slots 142 and then loads the plurality of wafers 112 in the wafer cassette.

In addition, the first boat 140 may be raised to have a uniform interval of vertical direction between the first slot 142 and the second slot 152.

Consequently, in a wafer loading/unloading method for use in a semiconductor manufacturing apparatus, front faces 112a of a plurality of wafers 112 are positioned face to face with a given interval therebetween, and back faces 112b of the plurality of wafers 112 are positioned face to face with becoming approximately to each other, thereby storing a relatively greater number of wafers 112 within reaction tube 110 in performing a diffusion or deposition process and so increasing productivity.

It does not matter herein to change the direction of a plurality of wafers 112 loaded in the first and second boats 140 and 150. For example, the plurality of wafers 112 may be loaded so that the front face 112a of each wafer 112 is supported by the first slot 142 of the first boat 140 and the back face 112b of each wafer 112 is supported by the second slot 152 of the second boat 150. Additionally, the distance between back faces 112b of the plurality of wafers 112 loaded in the first and second boats 140 and 150 should be relatively short, and the distance between front faces 112a thereof should be relatively wider. Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A semiconductor manufacturing apparatus, comprising:
a first boat and a second boat having a plurality of first slots and a plurality of second slots, respectively, and disposed such that the first slots and the second slots alternate each other, the first boat mounting a plurality of first wafers in the first slots to support front faces of the first wafers in a predetermined direction, the second boat mounting a plurality of second wafers in the second slots to support back faces of the second wafers in the predetermined direction;
a reaction tube having an opening and containing the first and second boats mounting the first and second wafers;
a plate sealing up the opening of the reaction tube containing the first boat and the second boat;
a reaction gas supplier supplying reaction gas into the sealed reaction tube for a predetermined process, and wherein each of the first slots of the first boat having the first wafers mounted thereon is at a different height of the semiconductor manufacturing apparatus than a height of each of the second slots of the second boat having the second wafers mounted thereon during the predetermined process; and
a reaction gas exhauster exhausting the reaction gas from the reaction tube to the external of the reaction tube after the predetermined process.

2. The apparatus of claim 1, wherein the first and second slots each have a tilted support face of a given angle supporting the back or front face of a corresponding wafer.

3. The apparatus of claim 1, wherein the first boat is movable with respect to the second boat.

4. The apparatus of claim 3, wherein, during the predetermined process, the distance between facing front faces of neighboring first and second wafers is longer than the distance between facing back faces of neighboring first and second wafers.

5. A semiconductor manufacturing apparatus, comprising:
a first boat and a second boat having a plurality of first slots and a plurality of second slots, respectively, and disposed such that the first slots and the second slots alternate each other;
a transfer robot holding a plurality of first wafers with a plurality of blades, loading the first wafers into the first slots to support front faces of the first wafers in a predetermined direction, holding a plurality of second wafers with the plurality of blades, and loading the second wafers into the second slots to support back faces of the second wafers in the predetermined direction;
a reaction tube having an opening and containing the first and second boats mounting the first and second wafers;
a plate sealing up the opening of the reaction tube containing the first boat and the second boat;
a reaction gas supplier supplying reaction gas into the sealed reaction tube for a predetermined process, and wherein each of the first slots of the first boat having the first wafers mounted thereon is at a different height of the semiconductor manufacturing apparatus than a height of each of the second slots of the second boat having the second wafers mounted thereon during the predetermined process; and
a reaction gas exhauster exhausting the reaction gas from the reaction tube to the external of the reaction tube after the predetermined process.

6. The apparatus of claim 5, wherein the first and second slots each have a tilted support face of a given angle supporting the back or front face of a corresponding wafer.

7. The apparatus of claim 5, wherein the first boat is movable with respect to the second boat.

8. The apparatus of claim 7, wherein, during the predetermined process, the distance between facing front faces of neighboring first and second wafers is longer than the distance between facing back faces of neighboring first and second wafers.

9. The apparatus of claim 5, wherein the plurality of blades hold the first and second wafers by suction.

10. The apparatus of claim 9, wherein the plurality of blades comprise a vacuum line to hold the first and second wafers by suction.

11. The apparatus of claim 5, wherein, during loading either the first wafers or the second wafers, the distance between the blades is reduced with corresponding wafers held by the blades, and then the blades rotate to rotate the corresponding wafers.

12. The apparatus of claim 11, wherein the plurality of blades each comprise a guide protruding from at least one face of a corresponding blade around a wafer mounting area to prevent held wafers from moving or deviating from the blades during rotating.

13. The apparatus of claim 5, wherein the plurality of blades hold the first and second wafers by clamps.

14. A wafer loading/unloading method for use in a semiconductor manufacturing apparatus including a reaction tube containing a first boat and a second boat which have a plurality of first slots and a plurality of second slots, respectively, and are disposed such that the first slots and the second slots alternate each other, the method comprising:
loading a plurality of first wafers into the first slots to support front faces of the first wafers in a predetermined direction;
loading a plurality of second wafers into the second slots to support back faces of the second wafers in the predetermined direction;
making the distance between facing front faces of neighboring first and second wafers larger than the distance between facing back faces of neighboring first and second wafers;
performing a predetermined process on the facing front faces of the neighboring first and second wafers which have the larger distance therebetween than the distance between the facing back faces of the neighboring first and second wafers, and wherein each of the first slots of the first boat having the first wafers mounted thereon is at a different height of the semiconductor manufacturing apparatus than a height of each of the second slots of the second boat having the second wafers mounted thereon during the predetermined process; and
unloading the first and second wafers from the first and second slots.

15. The method of claim 14, wherein the first and second wafers are unloaded to direct the front faces of the first and second wafers in the same direction.

* * * * *